(12) United States Patent
Tsuneta et al.

(10) Patent No.: US 7,227,144 B2
(45) Date of Patent: Jun. 5, 2007

(54) SCANNING TRANSMISSION ELECTRON MICROSCOPE AND SCANNING TRANSMISSION ELECTRON MICROSCOPY

(75) Inventors: Ruriko Tsuneta, Fuchu (JP); Masanari Koguchi, Kunitachi (JP); Takahito Hashimoto, Hitachinaka (JP); Kuniyasu Nakamura, Musashino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/328,173

(22) Filed: Jan. 10, 2006

(65) Prior Publication Data

US 2006/0151701 A1 Jul. 13, 2006

(30) Foreign Application Priority Data

Jan. 12, 2005 (JP) .............................. 2005-004660

(51) Int. Cl.
*G21K 7/00* (2006.01)
(52) U.S. Cl. .................. 250/311; 250/310; 250/307; 250/306; 356/401; 356/372; 356/399; 355/77
(58) Field of Classification Search ............... None
See application file for complete search history.

(56) References Cited

U.S. PATENT DOCUMENTS

2006/0113469 A1* 6/2006 Baba et al. ................. 250/310

FOREIGN PATENT DOCUMENTS

JP 2001-093459 4/2001

* cited by examiner

*Primary Examiner*—Nikita Wells
*Assistant Examiner*—Zia R. Hashmi
(74) *Attorney, Agent, or Firm*—Antonelli, Terry, Stout & Kraus, LLP.

(57) ABSTRACT

A scanning transmission electron microscope which enhances correction accuracy of a de-scanning coil for canceling a transmitted-electron-beam position change on an electron detector. Here, this transmitted-electron-beam position change appears in accompaniment with a primary-electron-beam position change on a specimen caused by a scanning coil. First, control over the scanning coil is digitized. Moreover, while being synchronized with a digital control signal resulting from this digitization, values in a de-scanning table registered in a FM(2) are outputted to the de-scanning coil. Here, the de-scanning table is created as follows: Diffraction images before and after activating the scanning coil and the de-scanning coil are photographed using a camera. Then, based on a result acquired by analyzing a resultant displacement quantity of the diffraction images by the image processing, the de-scanning table is created.

10 Claims, 16 Drawing Sheets

DIFFRACTION IMAGE         STEM IMAGE

DIFFRACTION IMAGE         STEM IMAGE

DIFFRACTION IMAGE         STEM IMAGE

SCANNING TRANSMISSION ELECTRON MICROSCOPE AND SCANNING TRANSMISSION ELECTRON MICROSCOPY

INCORPORATION BY REFERENCE

The present application claims priority from Japanese application JP 2005-004660 filed on Jan. 12, 2005, the content of which is hereby incorporated by reference into this application.

BACKGROUND OF THE INVENTION

The present invention relates to a scanning transmission electron microscope (: STEM). More concretely, it relates to a control device and method for controlling an electron beam which has passed through a specimen.

The STEM is a device for visualizing specimen structure with a sub-nanometer high space resolution. A raster scanning of an electron beam which is converged down to a nanometer order is performed on a specimen whose film is thinned down to a few hundreds of nm. Moreover, a signal generated from an electron-beam irradiation area is detected, then being synchronized with the raster scanning. This synchronization allows the two-dimensional image to be formed. Examples of the signal generated from the electron-beam irradiation area are a transmitted electron beam, a secondary electron beam, and characteristic X-rays.

FIG. 2 is a basic configuration diagram of the general STEM. The direction parallel to an optical axis 20 of the lens-barvel is defined as the Z direction, and the plane perpendicular to the optical axis is defined as the XY plane. A primary electron beam emitted from an electron gun 1 is accelerated up to a few hundreds of kV, then being formed in shape by a first condenser lens 2 and a second condenser lens 3. Moreover, the primary electron beam passes through a condenser aperture 4 for restricting an aperture angle of the primary electron beam, then being focused on a specimen 21 by an upper objective lens 7-1. Although an objective lens is, physically, a single lens, the specimen 21 is set up in a gap of the objective lens. For this reason, the upper objective lens 7-1 and a lower objective lens 7-2 are assumed as the ray diagram. Here, the lens 7-1 allows focal point of the primary electron beam to be achieved on the specimen, and the lens 7-2 has a role of projecting the transmitted electron beam which has passed through the specimen 21. An irradiation lens system including these lenses permits the primary electron beam to be converged down into a sub-nm diameter on the specimen 21.

The transmitted electron beam which has passed through the specimen 21 is projected onto an electron-beam detection system by the lower objective lens 7-2 and a projection lens 9. A raster scanning of the electron beam is performed within the XY plane by a scanning coil 5. Furthermore, a control signal for the scanning coil 5 and an output signal from an electron detector 14 are synchronized with each other, thereby forming a STEM image within a computer, and displaying the STEM image on a monitor. The characteristic of the STEM is that changing the detection signal permits various specimen information to be imaged in an easy and convenient manner. For example, if high-angle scattered electrons are detected using an electron annular detector 12, a high-angle annular dark field (: HAADF) image can be acquired. If low-angle scattered electrons in proximity to the optical axis 20 are selected using an angle selection aperture 13, and if the low-angle scattered electrons selected are detected using the electron detector 14, a bright field (: BF) image can be acquired.

JP-A-2001-93459 has disclosed the following technology: Namely, according to this technology, in the device configuration for acquiring an electron energy loss spectrum (: EELS) image, a change in incident position of the transmitted electron beam relative to the electron detector is cancelled using a de-scanning coil. Here, this change will occur in accompaniment with a change in incident position of the primary electron beam relative to the specimen.

If the incident position of the primary electron beam relative to the specimen 21 is changed, the incident position of the transmitted electron beam relative to the electron detector changes.

Accordingly, when selecting electrons under a certain condition out of the transmitted electrons by an aperture or a slit, and detecting the selected electrons, the transmitted electron beam displaces relative to the electron detector. On account of this displacement, the condition of the transmitted electrons to be detected at the electron detector changes depending on the incident position of the primary electron beam. This condition change causes an artifact to occur in the STEM image. The use of the de-scanning coil makes it possible to suppress this artifact. In JP-A-2001-93459, however, no disclosure has been made concerning a concrete control method for the de-scanning coil.

SUMMARY OF THE INVENTION

It is an object of the present invention to provide an electron microscope or its application device where a higher image correction is implemented. This implementation is accomplished by performing the de-scanning of the transmitted electron beam with an accuracy which is higher than the one in the conventional technology.

In order to implement the high-accuracy image correction, the present invention actually measures the displacement quantity of the transmitted electron beam, then controlling the de-scanning of the transmitted electron beam on the basis of an actually-measured result. For this purpose, in the electron microscope or an image correction system according to the present invention, there are provided an actually-measuring unit for actually measuring a displacement quantity of the transmitted electron beam, a de-scanning unit for de-scanning the transmitted electron beam, and a determination unit for determining a de-scanning quantity of the transmitted electron beam on the basis of the actually-measured displacement quantity. moreover, the electron microscope or the image correction system feedbacks the determined de-scanning quantity to the de-scanning unit, thereby executing the image correction.

As the actually-measuring unit for actually measuring the displacement quantity, the electron detector, e.g., a scintillator-equipped CCD camera, is usable. As the de-scanning unit for de-scanning the transmitted electron beam, the use of, e.g., the de-scanning coil, is preferable. If, however, some other appropriate unit exists, using that unit is also preferable. The determination unit for determining the de-scanning quantity is implemented by, e.g., a method where a computation unit for determining the de-scanning quantity on the basis of the actually-measured value is caused to execute a predetermined algorithm.

In a system where the de-scanning coil makes it possible to cancel the displacement of the transmitted electrons caused by the primary-electron-beam scanning, the most important device performance is the correction accuracy. In the conventional control system, however, implementation of an enhancement in the correction accuracy has required a complicated and troublesome device adjustment. Accordingly, we have devised the following system by digitizing the control over the scanning coil 5: Namely, while being synchronized with a digital control signal resulting from this digitization, values in a de-scanning table registered in a FM (2) are outputted to the de-scanning coil 11. Here, the de-scanning table is created as follows: Positions of the transmitted electrons before and after activating the scanning coil 5 and the de-scanning coil 11 are photographed using a camera. Then, based on a result acquired by analyzing a resultant displacement quantity of the transmitted electrons, the de-scanning table is created. Moreover, even if a set state of the device has been changed, it is possible to deal with this change by updating the de-scanning table. This makes it possible to execute a high-accuracy de-scanning at any time. Furthermore, updating the de-scanning table is automatically executed in accordance with an analysis flowchart registered in a computer 16. This makes the complicated and troublesome adjustment task unnecessary. If an end user has recognized that the transmitted electrons are being oscillated by the incident-electron-beam scanning, all that the end user has to do is to send an instruction of updating the de-scanning table.

The enhancement in the correction accuracy makes it possible to enlarge the field-of-view of the STEM image. This tremendously improves the usability of the device. Also, it becomes possible to make smaller the hole diameter of the angle selection aperture 13. This also allows an enhancement in the selection accuracy of the transmitted electron beam.

Other objects, features and advantages of the invention will become apparent from the following description of the embodiments of the invention taken in conjunction with the accompanying drawings.

DESCRIPTION OF THE INVENTION

In the electron microscope or the image correction system according to the present invention, there are provided an actually-measuring unit for actually measuring a displacement quantity of the transmitted electron beam, a de-scanning unit for de-scanning the transmitted electron beam, and a determination unit for determining a de-scanning quantity of the transmitted electron beam on the basis of the actually-measured displacement quantity. Moreover, the electron microscope or the image correction system feedbacks the determined de-scanning quantity to the de-scanning unit, thereby executing the image correction.

Figure 3:
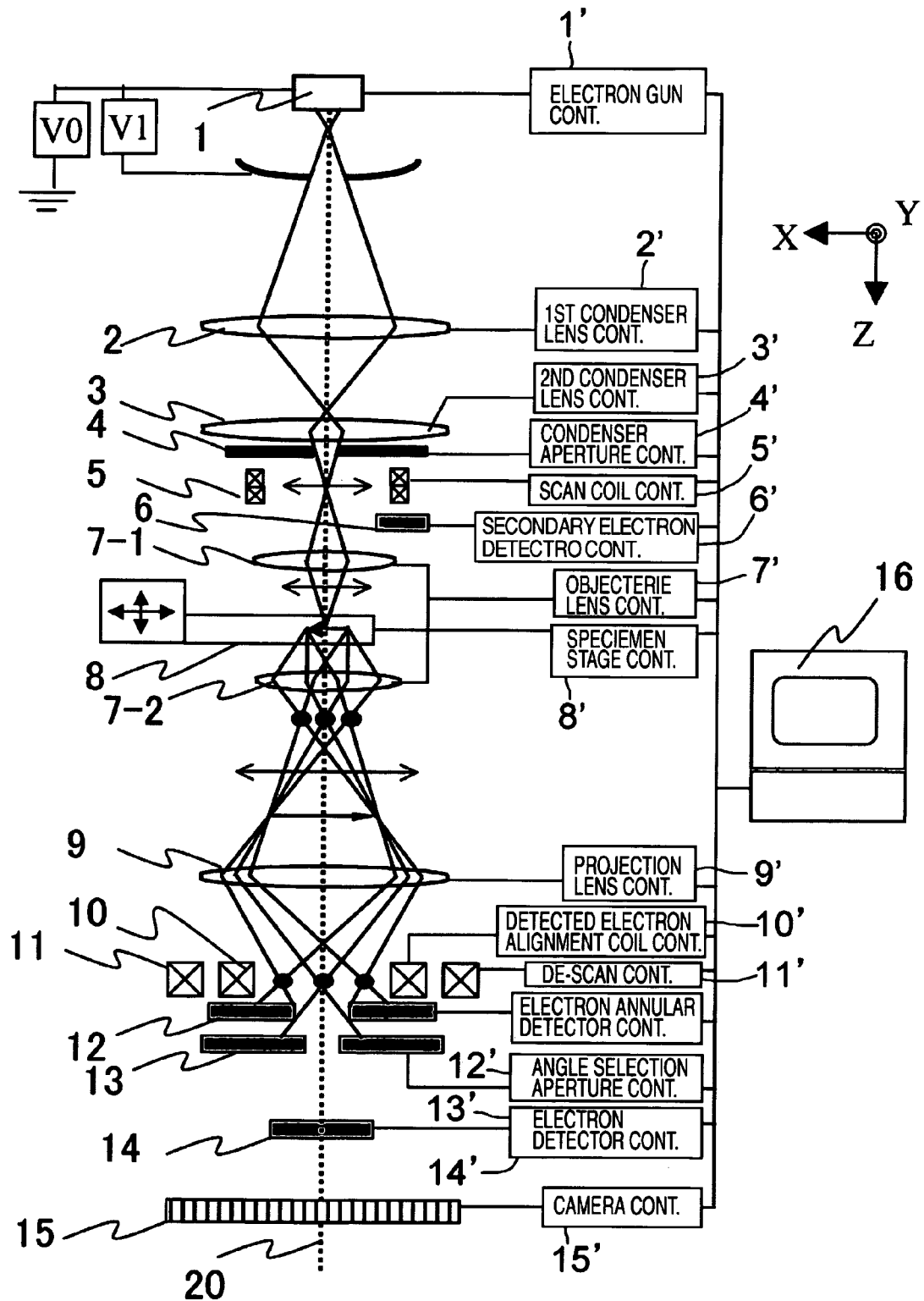
FIG. 3 is a basic configuration diagram of the STEM used in a first embodiment.

As the actually-measuring unit for actually measuring the displacement quantity, the electron detector, e.g., a scintillator-equipped CCD camera, is usable. If the transmitted electrons enter the scintillator, photons are generated from the entrance positions, then being detected by the CCD camera. The electron image photographed by the CCD camera is sent to an image processing unit. The image processing unit analyzes the displacement quantity of the transmitted electron beam caused by a displacement of the primary electron beam, then recording the analysis result into a memory. As the de-scanning unit for de-scanning the transmitted electron beam, the use of the de-scanning coil is preferable. If, however, some other appropriate unit exists, using that unit is also preferable. For example, in the STEM of a configuration as illustrated in FIG. 3, the transmitted electrons to be detected by the electron detector 14 may be corrected by causing the position of the angle selection aperture 13 to follow the displacement quantity of the transmitted electron beam.

Also, the transmitted electrons which are to form the STEM image may be corrected as follows: The electron detector 14 is changed to an electron-image detector, thereby being formed into a system for forming the STEM image by a detection signal in a specified pixel area. Then, the specified pixel area is caused to follow the displacement quantity of the transmitted electron beam, thereby correcting the transmitted electrons. The determination unit for determining the de-scanning quantity is implemented by, e.g., the following method: Namely, measurements are made concerning the correspondence between the control quantity of the scanning coil of the primary electron beam and the displacement quantity of the transmitted electron beam, and the correspondence between the control quantity of the de-scanning unit and the displacement quantity of the transmitted electron beam. Then, from these actually-measured values, a computation unit calculates the control quantity of the de-scanning unit necessary for canceling the displacement of the transmitted electron beam caused by the displacement of the primary electron beam. The control quantity of the de-scanning unit is stored into a record unit such as the memory together with an electron-optics condition at the time of the measurements. At the time of executing the de-scanning, the de-scanning control quantity which is necessary in correspondence with an electron-optics condition at the time of the execution is read out, then being sent to the de-scanning unit. Incidentally, if the de-scanning control quantity under the electron-optics condition at the time of the execution has been not recorded in the memory, a de-scanning control quantity already recorded in the memory is sent to the de-scanning unit after a necessary computation has been applied thereto. For example, if the magnification differs between the measurement time and the execution time, a value acquired by making the magnification correction to the de-scanning control quantity already recorded in the memory is sent to the de-scanning unit.

Embodiment 1

Hereinafter, the explanation will be given below concerning a first embodiment. FIG. 3 illustrates the basic configuration diagram of the STEM used in the present embodiment. The direction parallel to an optical axis 20 of the housing is defined as the Z direction, and the plane perpendicular to the optical axis is defined as the XY plane. The present STEM includes the following configuration components: An electron gun 1 for emitting a primary electron beam, a first condenser lens 2 and a second condenser lens 3 for forming in shape the primary electron beam emitted from the electron gun 1, a condenser aperture 4 for restricting an aperture angle of the primary electron beam, a scanning coil 5 for allowing the primary electron beam to be scanned on a specimen, an objective lens 7 for allowing focal point of the primary electron beam to be achieved on the specimen, a specimen stage 8 for holding the specimen 21, a secondary-electron detector 6 for detecting secondary electrons emitted from surface of the specimen 21, a projection lens 9 for projecting a transmitted electron beam, which has passed through the specimen 21, onto an electron-beam detection system, a detected-electron alignment coil 10 for aligning the transmitted electrons onto the electron-beam detection system, a de-scanning coil 11 for canceling a displacement of the transmitted electron beam on an angle selection aperture 13 caused by an incident-electron-beam scanning on the specimen 21, an electron annular detector 12 for detecting high-angle scattered electrons out of the transmitted electrons, the angle selection aperture 13 for extracting from the transmitted electrons an electron beam having a desired detection angle, an electron detector 14 for detecting the transmitted electrons which have passed through the angle selection aperture 13, an electron detection camera 15 for photographing a diffraction image formed by the transmitted electrons, control circuits for controlling the electron gun, the respective electron lenses, the respective coils, the respective apertures, the specimen stage, and the respective detectors, and a computer 16 for controlling the respective control circuits. The angle selection aperture 13 and the electron detector 14 are formed into a movable-type mechanism which will deviate from the optical axis when the diffraction image is observed by the electron detection camera 15.

Next, the explanation will be given below concerning processing steps for acquiring the STEM image by using the device illustrated in FIG. 3. The primary electron beam is extracted from the electron gun 1 by an extraction voltage V1. Then, an acceleration voltage V0 is applied to the primary electron beam extracted. The specimen 21 is mounted on the specimen stage 8, then being inserted into a specimen chamber. Current values for the first condenser lens 2, the second condenser lens 3, the objective lens 7, and the projection lens 9 are set at predetermined values. Although the objective lens 7 is, physically, a single lens, the specimen is set up in a gap of the objective lens. For this reason, an upper objective lens 7-1 and a lower objective lens 7-2 are assumed as the ray diagram. Here, the upper objective lens 7-1 allows focal point of the primary electron beam to be achieved on the specimen, and the lower objective lens 7-2 has a role of projecting the transmitted electron beam which has passed through the specimen 21. The primary electron beam is formed in shape by the first condenser lens 2 and the second condenser lens 3, then being focused on surface of the specimen 21 by the upper objective lens 7-1. The transmitted electron beam which has passed through the specimen 21, after being image-formed by the lower objective lens 7-2 and the projection lens 9 one after another, is projected onto the electron-beam detection system. Furthermore, the scanning coil 5 is controlled, thereby performing a raster scanning of the microscopically-converged electron beam within the XY plane on the surface of the specimen 21. Then, scanning position information by the scanning coil 5 and an output signal from the electron detector 14 are synchronized with each other, thereby forming a STEM image within the computer, and displaying the STEM image on a monitor.

The characteristic of the STEM is that changing the electrons to be detected permits various specimen information to be imaged in an easy and convenient manner. For example, if the high-angle scattered electrons are detected using the electron annular detector 12, a high-angle annular dark field (: HAADF) image can be acquired. If low-angle scattered electrons in proximity to the optical axis 20 are selected using the angle selection aperture 13, and if the low-angle scattered electrons selected are detected using the electron detector 14, a bright field (: BF) image can be acquired. If a diffracted electron beam with a specific diffraction index is guided from the transmitted electron beam into the hole of the angle selection aperture 13 by using the detected-electron alignment coil 10, and if the diffracted electron beam guided is detected using the electron detector 14, a dark field image with the specified diffraction index can be acquired. Also, if the secondary electrons emitted from the surface of the specimen 21 are detected using the secondary-electron detector 6, a highly-accelerated secondary-electron image can also be acquired.

The secondary-electron detector 6 is configured to take in the secondary electrons which have been emitted in a variety of directions. Consequently, even if incident position of the primary electron beam on the specimen 21 is changed, detection efficiency of the secondary-electron beam seldom changes. On the other hand, the transmitted-electron detector 14 detects the transmitted electrons in such a manner that, depending on a diffraction direction of the transmitted electron beam, the transmitted-electron detector 14 selects the transmitted electrons. For this selection to be implemented, there is provided a projection lens system including the units such as the projection lens 9, the detected-electron alignment coil 10, and the angle selection aperture 13. In this case, if the incident position of the primary electron beam on the specimen 21 is changed, orbits of the transmitted electrons change in the projection lens system. As a result, the incident position of the transmitted electron beam on the angle selection aperture 13 changes.

Figure 4:
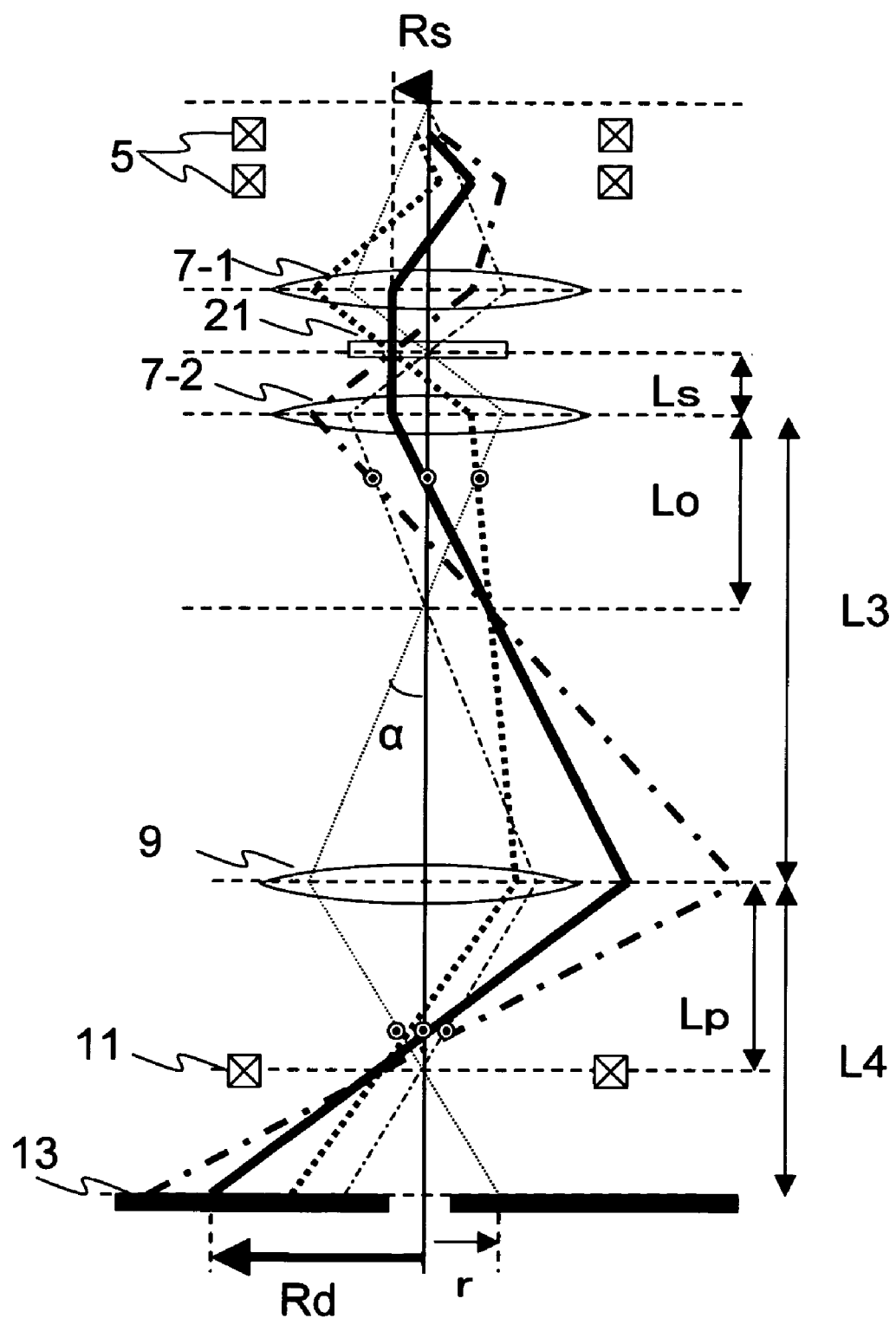
FIG. 4 is a ray diagram for illustrating the correspondence between an axis-shift quantity Rs on the specimen and an axis-shift quantity Rd on the angle selection aperture.

FIG. 4 illustrates a change in the incident position of the transmitted electron beam on the angle selection aperture 13 in the case where the incident position of the primary electron beam on the specimen 21 is changed. If the incident position of the primary electron beam on the specimen 21 is displaced by a displacement quantity Rs from on the optical axis, the incident position of the transmitted electron beam entering the angle selection aperture 13 displaces by a displacement quantity Rd. It is possible to calculate a substantial value of the displacement quantity Rd from optical magnification of the lower objective lens 7-2 and that of the projection lens 9. Concretely, by calculating the optical magnification Mo of the lower objective lens 7-2, the optical magnification Mp of the projection lens 9, and a beam spread r on the angle selection aperture 13, the displacement quantity Rd can be approximately calculated based on the following expression 1:

$$R_d \cong R_s \cdot M_o \cdot M_p + r = R_s \cdot \frac{L_o}{L_s} \cdot \frac{L_p}{L_3 - L_o} + \alpha \cdot (L_3 - L_o) \cdot \frac{L_4 - L_p}{L_p} \quad (1)$$

Figure 5:
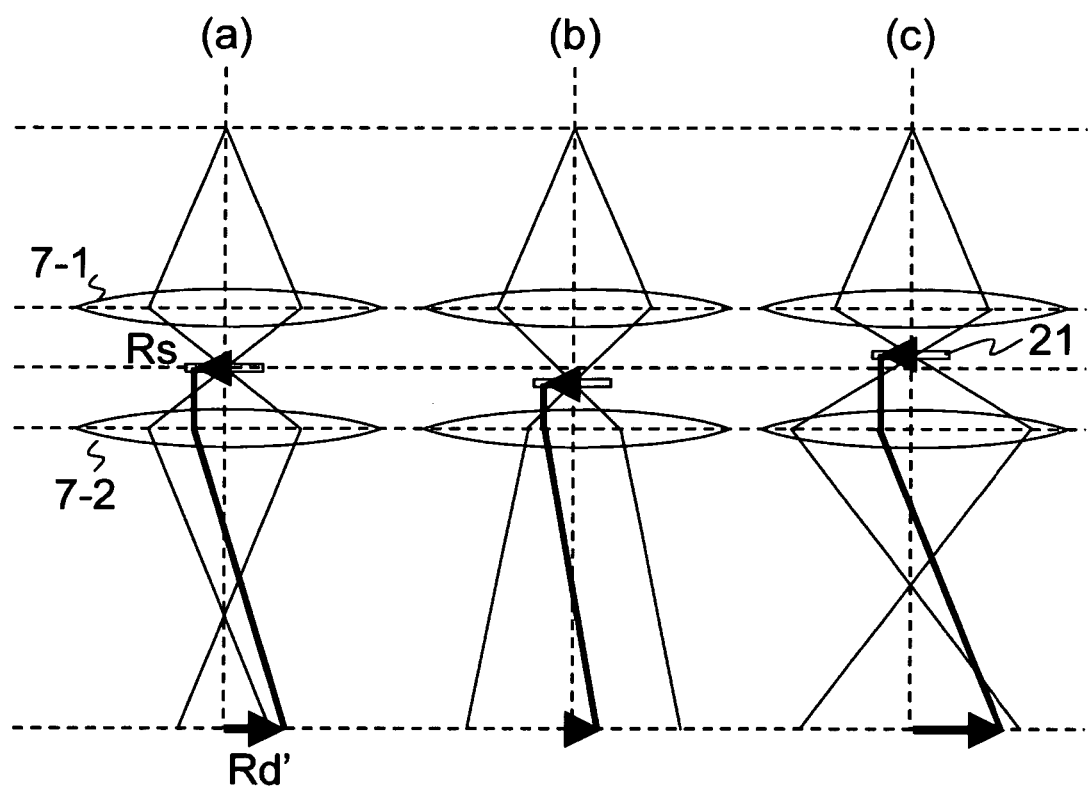
FIG. 5 is an explanatory diagram for explaining differences in the axis-shift quantity on the angle selection aperture, the differences being attributed to differences in the specimen height within the objective lens.

However, the settings of the objective lens 7 and the projection lens 9 change because of a variety of factors as well. For example, FIG. 5 illustrates changes in Rd which occur when z position of the specimen 21 within the objective lens is changed. For simplicity, the consideration will be given regarding the case where the projection lens is omitted. FIG. 5(*a*) illustrates the case where the specimen 21 is positioned at the center of the objective lens. If the specimen 21 is positioned in the downstream than the center of the objective lens, in order to achieve the focal point of the primary electron beam onto the specimen 21, the magnetizing excitation of the objective lens 7 is lowered thereby to lengthen the focal length thereof (FIG. 5(*b*)). Meanwhile, if the specimen 21 is positioned in the upstream than the center of the objective lens, the focal length of the objective lens 7 is shortened (FIG. 5(*c*)).

As described above, if the height of the specimen 21 is changed, position of the image plane of the objective lens, i.e., Lo, changes. Moreover, it is obvious that position of the image plane of the projection lens, i.e., Lp, also changes. The expression 1 shows that, if Lo or Lp is changed, Rd will change. As factors for changing Rd, in addition to the z-position change in the specimen, z-position change in a virtual light-source can also be mentioned. Furthermore, there are some cases where, depending on an adjustment state of the electron-optics system, Rd will change asymmetrically with reference to the optical axis. For example, if an astigmatism exists in the projection lens, the change quantity of Rd also turns out to have an astigmatism. Also, if Rd becomes larger, it becomes impossible to neglect influence of an off-axis aberration of the projection lens. Implementation of the high-accuracy de-scanning requires a system which makes it possible to cancel these factors in an easy and convenient manner.

Figure 1:
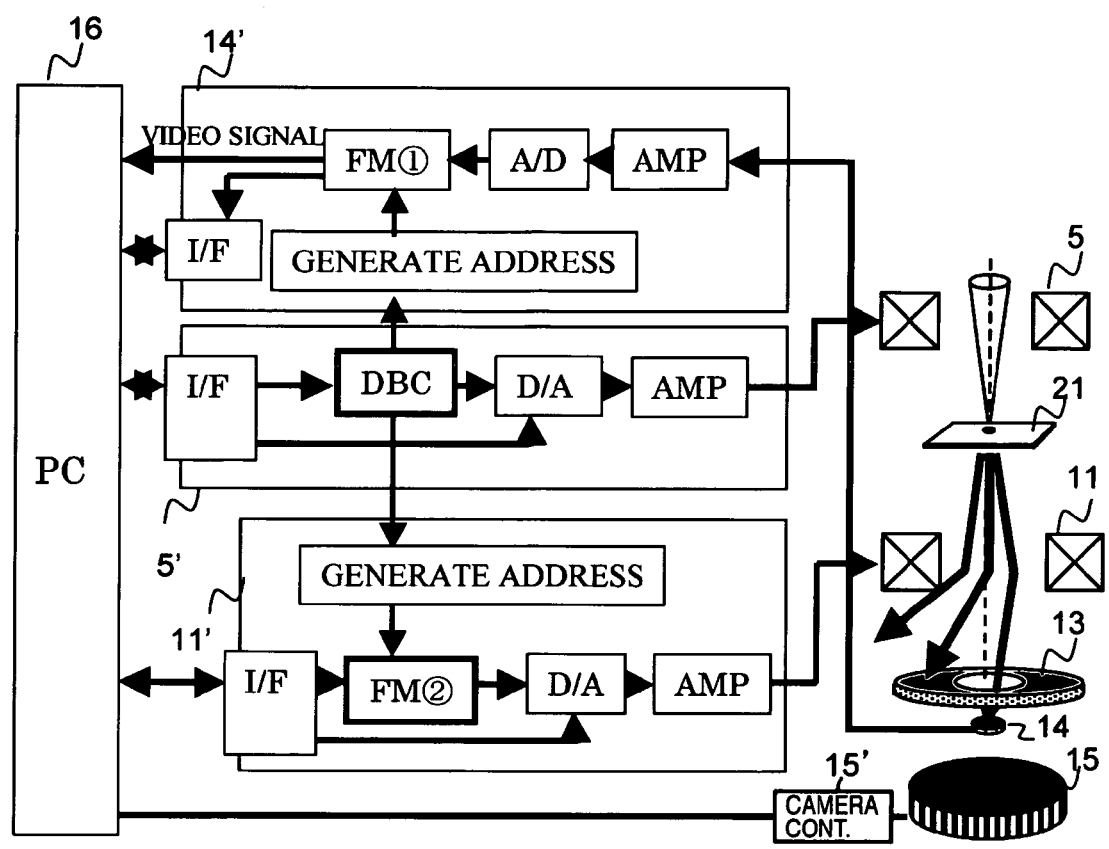
FIG. 1 is a basic configuration diagram of a de-scanning system according to the present invention.
Figure 2:
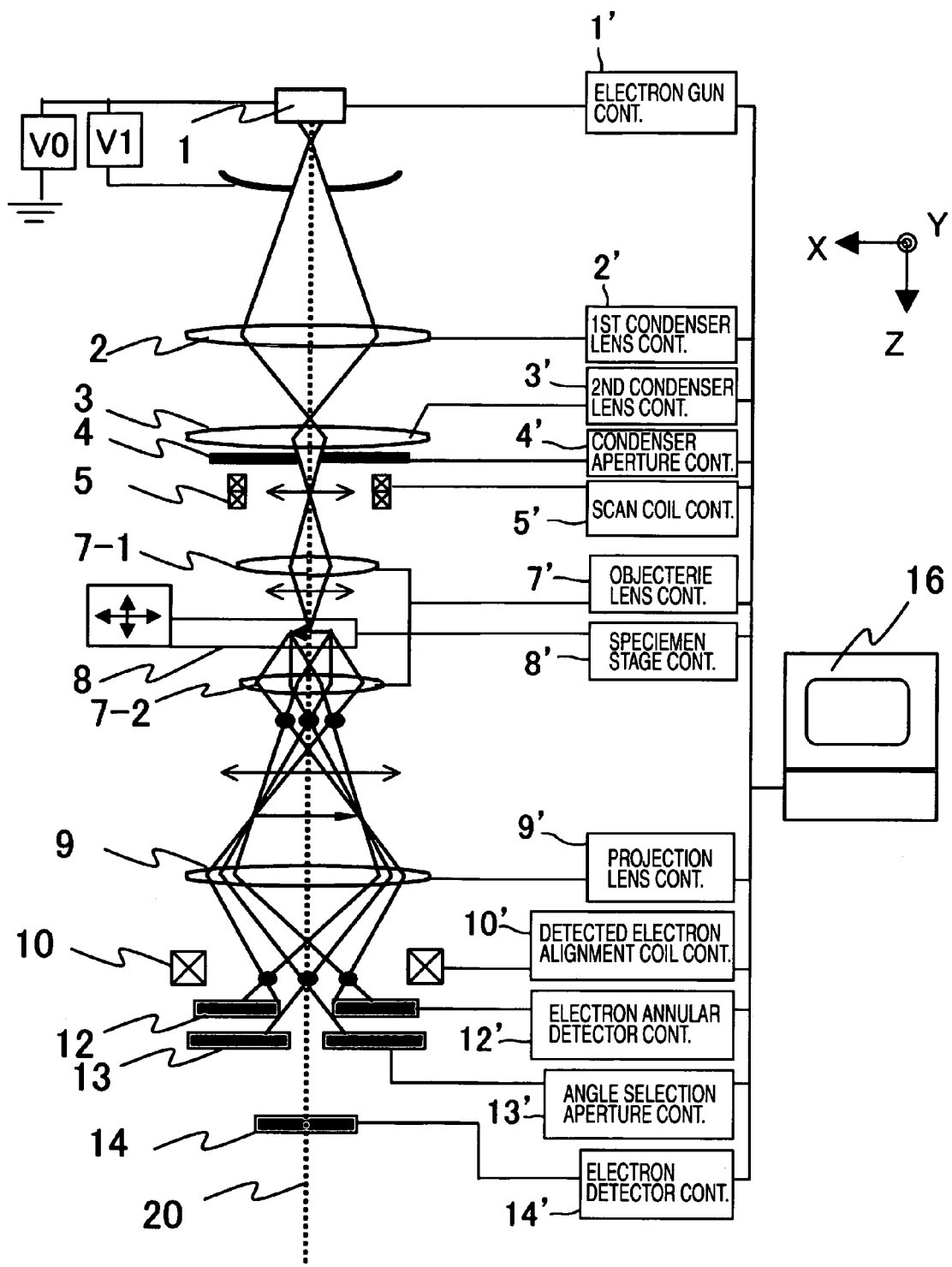
FIG. 2 is the basic configuration diagram of the general STEM.

Accordingly, in order to implement the high-accuracy de-scanning, we have devised the following system: Namely, this system actually measures Rd, then creating a de-scanning table on the basis of the actually-measured result. Moreover, based on this de-scanning table, this system controls the de-scanning coil 11. FIG. 1 illustrates a system configuration diagram thereof. In the present system, the control value for the scanning coil 5 is outputted from a DBC (: Digital Beam Control) circuit. While being synchronized with this digital control signal, values in the de-scanning table registered in a FM (: Frame Memory) (2) are outputted to the de-scanning coil 11. In addition to a system for writing the output from the electron detector 14 into a FM (: Frame Memory) (1) in synchronization with the scanning coil 5, the correction system in the present embodiment also includes a system for outputting the values recorded in the FM (2) in the manner of being synchronized with the scanning coil 5. The de-scanning table is caused to have the same pixel number as that of the STEM image. It is more efficient to make the pixel number of the de-scanning table and that of the STEM image equal to each other. This is because no calculation is needed when reading the control values from the de-scanning table. If, however, an algorithm is added which is used for performing a reading-through or overlapping of the control values, the pixel number of the de-scanning table and that of the STEM image may differ from each other.

At the time of the factory shipping, it is preferable that the de-scanning table measured by electron-optics simulation values or the same kind of device be stored into the frame memory. By using this de-scanning table, a beginner who has not mastered a proofreading method for the de-scanning table executes the de-scanning. It is advisable that, after mastering the proofreading method, the beginner create the de-scanning table by using the most up-to-date measurement values thereby to enhance the de-scanning accuracy. Incidentally, if a device installer performs the proofreading of the de-scanning table at the time of the installment, it is allowable that the frame memory at the time of the factory shipping be left blank.

Figure 18:
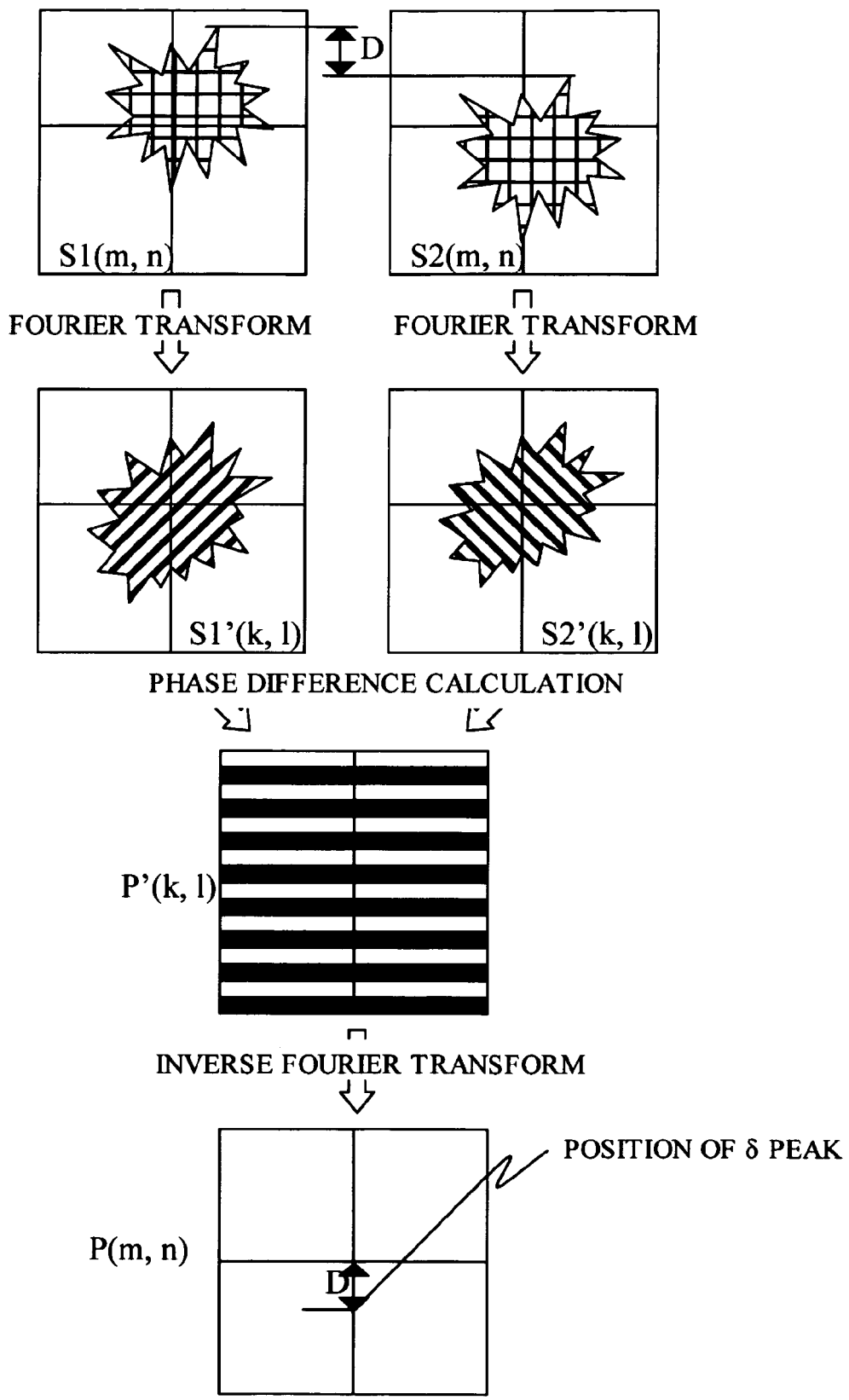
FIG. 18 is an explanatory diagram for illustrating processing steps for analyzing position-shift quantity between the images.

The de-scanning table is created as follows: Diffraction images before and after the activations of the scanning coil and the de-scanning coil are photographed using a camera. Then, based on a result acquired by analyzing a resultant displacement quantity of the diffraction images by the image processing, the de-scanning table is created. Various pattern matching methods, such as phase-limited correlation method, normalization correlation method, and least-squares method, are usable as the analysis method for analyzing the displacement quantity between the diffraction images. Incidentally, the phase-limited correlation method has been used for the displacement-quantity analysis at this time. Hereinafter, referring to FIG. 18, the explanation will be given below concerning this phase-limited correlation method. Assume two pieces of discrete images S1(m, n) and S2(m, n) with a position shift $D=(D_x, D_y)$ existing therebetween, and describe S1(m, n) as S1(m, n)=S2(m+$D_x$, n+$D_y$). Let two-dimensional discrete Fourier transformations of S1(m, n) and S2(m, n) be S1'(k, l) and S2'(k, l), respectively. Since a formula F{S(m+$D_x$, n+$D_y$)}=F{S(m, n)} exp (i$D_x$·k+i$D_y$·l) exists in the Fourier transformation, S1'(k, l) can be converted into S1'(k, l)=S2'(k, l) exp (i$D_x$·k+i$D_y$·l).

Namely, the position shift between S1'(k, l) and S2'(k, l) can be expressed by the phase difference exp (i$D_x$·k+i$D_y$·l) =P'(k, l). P'(k, l) is also a wave whose period is equal to ($D_x$, $D_y$.) As a result, a δ-function-like peak occurs at the position of ($D_x$, $D_y$) in an analysis image P(m, n) which results from applying an inverse Fourier transformation to the phase-difference image P'(k, l). Incidentally, instead of eliminating all the information on amplitude, a log or $\sqrt{}$ processing is applied to the amplitude component of S1'(k, l)·S2'(k, l)*=|S1'| |S2'| exp(iD$_x$·k+iD$_y$·l), thereby calculating an image whose amplitude component is suppressed. Then, applying the inverse Fourier transformation to this image also causes a δ-function-like peak to occur at the position of (D$_x$, D$_y$) of the position-shift vector. Accordingly, the position-shift analysis may also be performed using this image. Moreover, applying the Fourier transformation to the phase-difference image P'(k, l) also causes a δ-function-like peak to occur at (−D$_x$, −D$_y$). Consequently, the position-shift analysis may also be executed using the Fourier transformation image of the phase-difference image P'(k, l).

It can be assumed that only the δ-function-like peak exists in the analysis image P(m, n). This condition allows the position of the δ-function-like peak to be determined with an accuracy of digits to the right of the decimal point by using a center-of-gravity position calculation or function fitting. Also, the portion other than the δ-function-like peak can be regarded as a noise. Accordingly, the proportion of intensity of the δ-function-like peak relative to intensity of the entire analysis image P(m, n) can be regarded as the coincidence degree between the images. In the conventional position-shift analysis methods, it was difficult to evaluate reliability of the position-shift analysis result. Also, there was a shortage of the frequency component needed for the analysis. Accordingly, if a wrong position-shift quantity is outputted, it turns out that the analysis flowchart will proceed based on this wrong position-shift quantity. In contrast thereto, in the present position-shift analysis method, the coincidence degree is outputted. Consequently, it is possible to execute the following analysis flowchart: Namely, a lower-limit value of the coincidence degree is set. Then, if the coincidence degree is found to be smaller than the lower-limit value, the coincidence degree is eliminated as a value which could not be analyzed. Moreover, the coincidence degree is automatically interpolated by an analysis result in proximity thereto.

Figure 6:
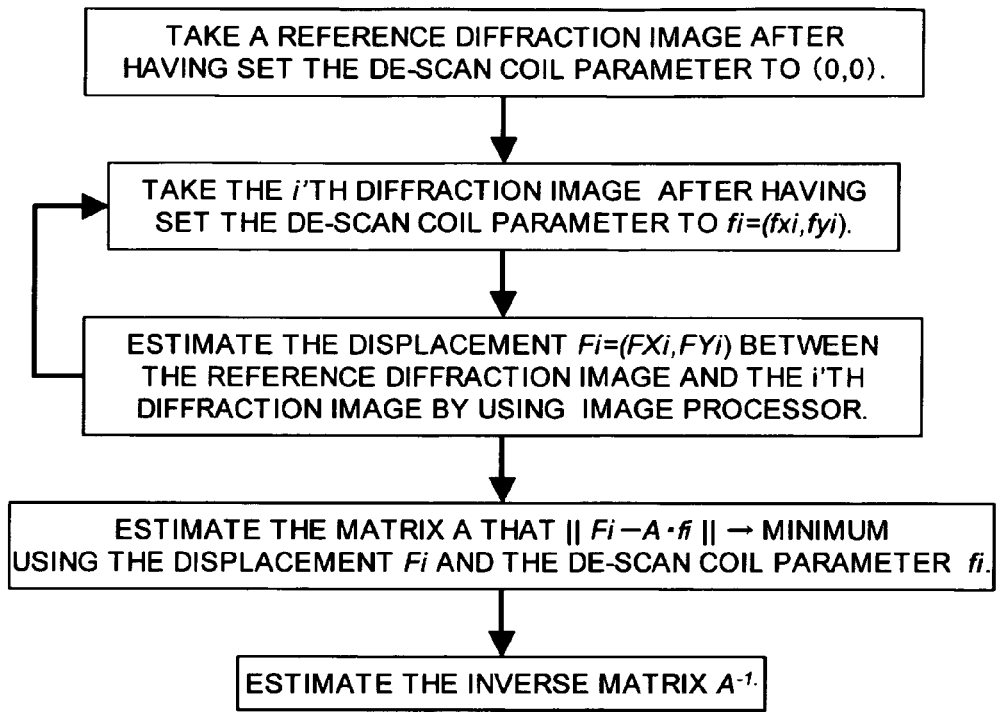
FIG. 6 is a flowchart for analyzing the relationship between a control-value change quantity of the de-scanning coil 11 and a displacement quantity of diffraction images.
Figure 7:
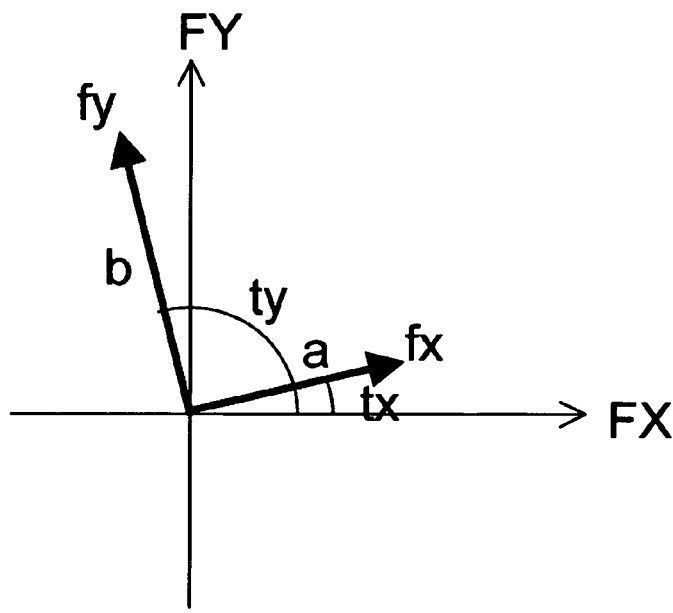
FIG. 7 is an explanatory diagram for explaining the relationship between the control-value change quantity f of the de-scanning coil 11 and the displacement quantity F of the diffraction images.

FIG. 6 illustrates a flowchart for determining a control-value change quantity of the de-scanning coil 11 needed for displacing a diffraction image by a predetermined quantity. Since the de-scanning coil 11 includes an x deflection and a y deflection, the control value for the de-scanning coil 11 is specified as f=(fx, fy). First, a reference diffraction image is photographed at f0=(0, 0). After that, diffraction images at several control values fi=(fxi, fyi) are photographed, then analyzing displacement quantities Fi=(FXi, FYi) relative to the reference diffraction image by using the image processing. A measurement condition therefor is set. For example, if movable range of the de-scanning coil is set as being ±1024 digits in the fx deflection and ±1024 digits in the fy deflection, a 121-point measurement condition is set in a lattice-like manner such that 11 points from −1000 digits to +1000 digits with a 100-digit spacing are specified to fx, and 11 points from −1000 digits to +1000 digits with a 100-digit spacing are specified to fy. Next, a conversion expression is acquired which determines the control-value change quantities of the de-scanning coil 11 needed for displacing the diffraction image by the predetermined quantities from measurement values acquired. No electromagnetic-field lens is provided between the de-scanning coil and the camera. Accordingly, it has been assumed that the conversion expression between the control-value change quantities of the de-scanning coil 11 and the displacement quantities of the diffraction image is describable by a 2×2 matrix A. Concretely, assuming the direction tx and pitch a of the fx deflection by the de-scanning coil, and the direction ty and pitch b of the fy deflection thereby (refer to FIG. 7), the following expression 2 is assumed:

$$\begin{bmatrix} FX_i \\ FY_i \end{bmatrix} = \begin{bmatrix} a \cdot \cos(t_x) & b \cdot \cos(t_y) \\ a \cdot \sin(t_x) & b \cdot \sin(t_y) \end{bmatrix} \cdot \begin{bmatrix} fx_i \\ fy_i \end{bmatrix} \quad (2)$$

Based on the measurement result, the parameters of the matrix A are optimized so that ||Fi−A·fi|| becomes equal to its minimum. An inverse matrix $A^{-1}$ of the optimized matrix A is calculated. The control-value change quantities fi of the de-scanning coil 11 needed for displacing the diffraction image by the displacement quantities Fi are calculated by multiplying the displacement quantities Fi of the diffraction image by $A^{-1}$. Incidentally, if a shift is large which exists between the displacement quantities calculated from the control-value change quantities of the de-scanning coil 11 by using the expression 2 and the actually-measured displacement quantities, the case is conceivable where, e.g., the axis deviation is large, and where the activation of the electrons changes in a vortex-like manner. In that case, it is necessary to add a term of the off-axis aberration to the conversion expression.

Figure 8:
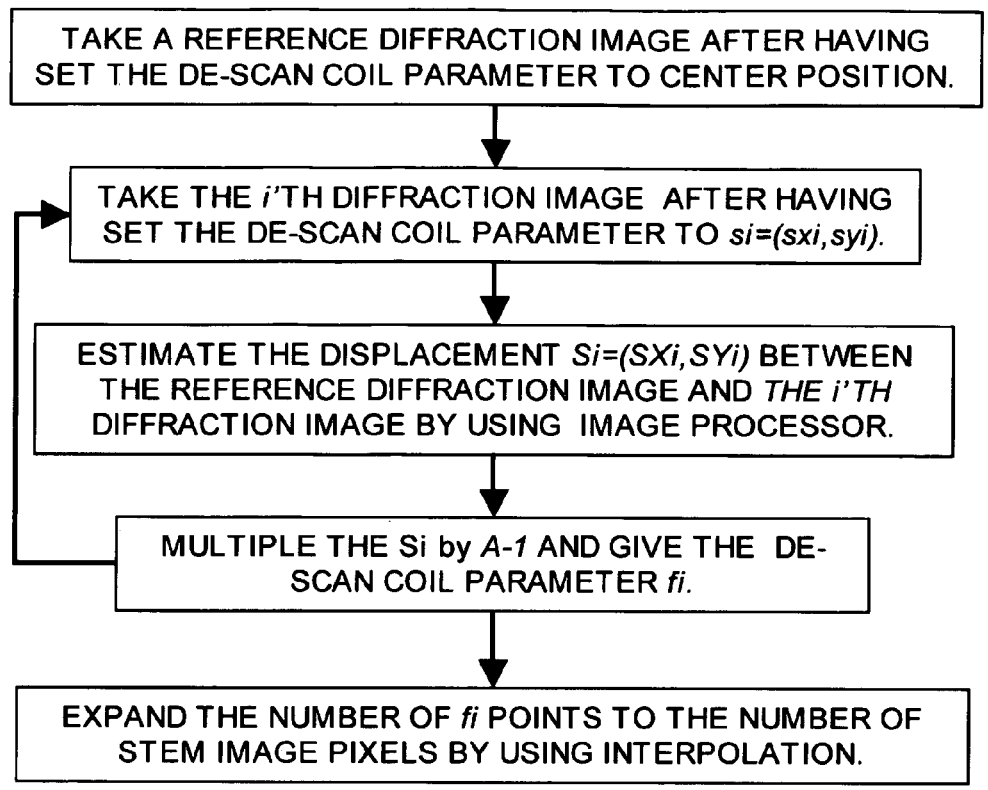
FIG. 8 is a flowchart for creating the de-scanning table from the displacement quantity of the diffraction images at the time when the control value for the scanning coil 5 is changed.

Next, the de-scanning table is created from a displacement quantity of the diffraction image caused by the control-value change quantity of the scanning coil 5. Since the objective lens 7 and the projection lens 9 exist between the scanning coil 5 and the camera 15, there exists a possibility that the displacement quantity of the diffraction image may complicatedly change depending on setting conditions therefor. Accordingly, instead of trying to fit, into a mathematical expression, the displacement quantity of the diffraction image caused by the control-value change quantity of the scanning coil 5, it has been decided that the measurement values be used just as they are. Incidentally, it is insufficient to measure the same pixel number as that of the STEM image. Also, it can be assumed that the electromagnetic field will never change so steeply. Consequently, it has been decided that measurement points be provided with a proper spacing set therebetween, and that interpolation be performed using the spline interpolation. FIG. 8 illustrates a flowchart therefor. Since the scanning coil 5 also includes an x deflection and a y deflection, the control value for the scanning coil 5 is specified as s=(sx, sy). Here, it is assumed that movable range of the scanning coil 5 has been set as being 1 digit to 640 digits in the sx direction and 1 digit to 480 digits in the sy direction. A reference diffraction image at the center of the field-of-view, i.e., at s=(320, 240) digits, is photographed. After that, diffraction images at several control values si=(sxi, syi) for the scanning coil 5 are photographed, then analyzing displacement quantities Si= (SXi, SYi) relative to the reference diffraction image by using the image processing.

As the measurement points., for example, 192 points are specified in a lattice-like manner such that 16 points from 20 digits to 620 digits with a 40-digit spacing are specified in the sx direction, and 12 points from 20 digits to 460 digits with a 40-digit spacing are specified in the sy direction. This specification makes it possible to measure, at the respective points, the displacement quantities of the diffraction image caused by the control-value change quantities of the scanning coil 5. Consequently, the control-value change quantities of the de-scanning coil 11 needed for canceling the above-described displacement quantities of the diffraction image are determined from the expression 2. Furthermore, the control-value change quantities determined are allocated onto a table whose pixel number is equal to the pixel number (i.e., 640×480) of the STEM image in accordance with the control values of the scanning coil 5 at the respective points. The value at a position to which the actually-measured result has been not allocated is interpolated by a method such as the spline interpolation, thereby completing the de-scanning table.

The de-scanning table simultaneously stores therein the STEM magnification with which the de-scanning table had been created. The setting of the scanning range of the primary electron beam, i.e., the STEM magnification, is modified many times during the specimen observation. It is quite inefficient to create the de-scanning table every time the setting is modified. Accordingly, the values in the de-scanning table are multiplied by a value which is inversely proportional to the magnification, then being outputted to the de-scanning coil. The magnification at the time when the de-scanning table had been created is recorded. When executing the de-scanning, the magnification at present is read. Moreover, the values in the de-scanning table are multiplied by the inverse of ratio of the read magnification relative to the recorded magnification, then being outputted to the de-scanning coil. If the oscillation of the diffraction image due to the primary-electron-beam scanning becomes conspicuous because the difference between the read magnification and the recorded magnification is large, re-creating the de-scanning table will be carried out.

Figure 9:
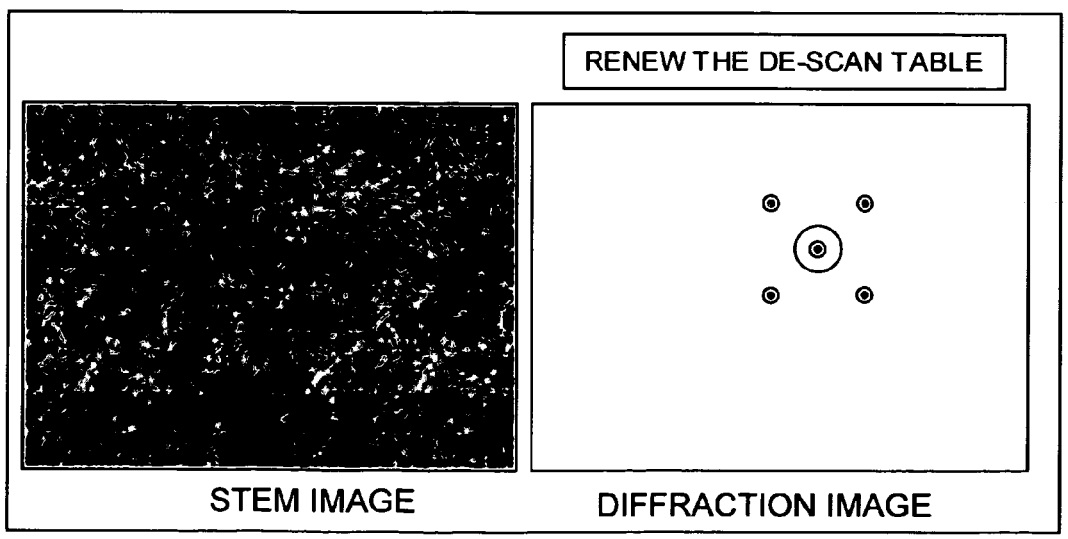
FIG. 9 is a control screen for an end user.
Figure 12A:
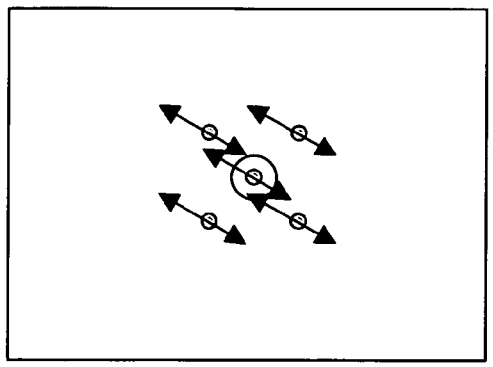
FIG. 12A, FIG. 12B, and FIG. 12C are an explanatory diagram for illustrating the diffraction image and the STEM image at the time when the de-scanning exhibits no function, an explanatory diagram therefor at the time when the de-scanning is insufficient, and an explanatory diagram therefor at the time when the de-scanning is being executed with an excellent accuracy, respectively.
Figure 12A:
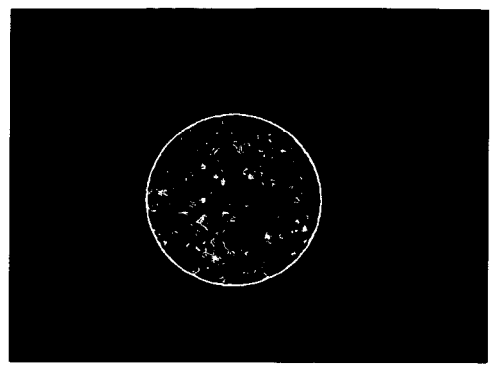
Figure 12B:
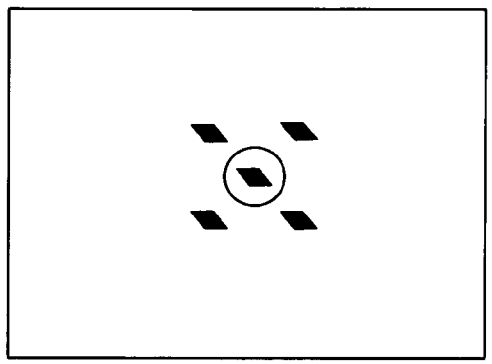
Figure 12B:
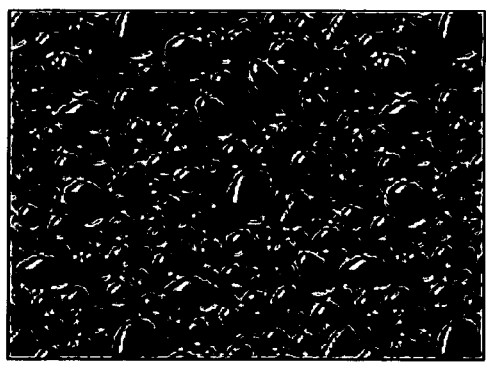
Figure 12C:
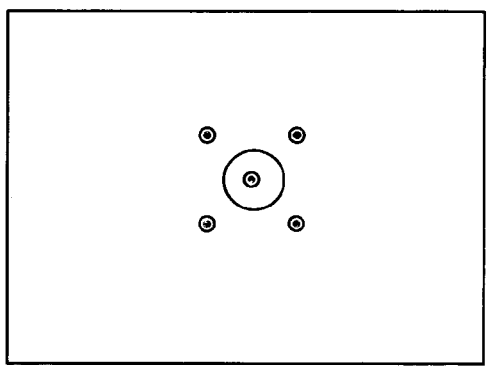
Figure 12C:
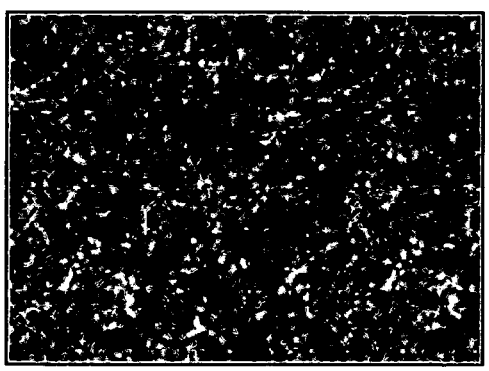

The above-described creation of the de-scanning table is automatically executed in accordance with the flowchart in FIG. 8. This makes it unnecessary for a user to perform the complicated and troublesome task. All that the user has to do is to issue the instruction by using a de-scanning table update icon. FIG. 9 illustrates a configuration example of the main control screen. In the system configuration in FIG. 3, the main control screen in FIG. 9 is displayed on the monitor of the PC 16. The main control screen illustrated in FIG. 9 displays thereon requirements such as the STEM image, the diffraction image, and the icon for issuing the instruction of creating the de-scanning table. The judgment on execution of the de-scanning table update is made mainly based on the diffraction image. As illustrated in FIG. 12A, if the diffraction image is being tremendously oscillated by the primary-electron-beam scanning, and if the transmitted electron beam to be defected deviates from the angle selection aperture 13, updating the de-scanning table can be said to be absolutely necessary. As illustrated in FIG. 12B, if the diffraction image is being slightly oscillated, a judgment which meets an observation purpose should be made. Incidentally, FIG. 12C illustrates the diffraction image and the STEM image at the time when the de-scanning has been executed with an excellent accuracy.

For example, when measuring the substantial configuration of a specimen, there exists no necessity for updating the de-scanning table. In the crystalline structure analysis, however, updating the de-scanning table is more advisable even if a slight oscillation were to be observed in the diffraction image. Clicking on or double-clicking on the de-scanning table update icon allows the most up-to-date de-scanning table to be created in accordance with the flowchart in FIG. 8. After that, the de-scanning coil will be controlled in accordance with this de-scanning table. Even the present device allows the most up-to-date de-scanning table to be created in a few minutes. Decreasing the number of the measurement points allows the most up-to-date de-scanning table to be created in a few tens of seconds.

Figure 10:
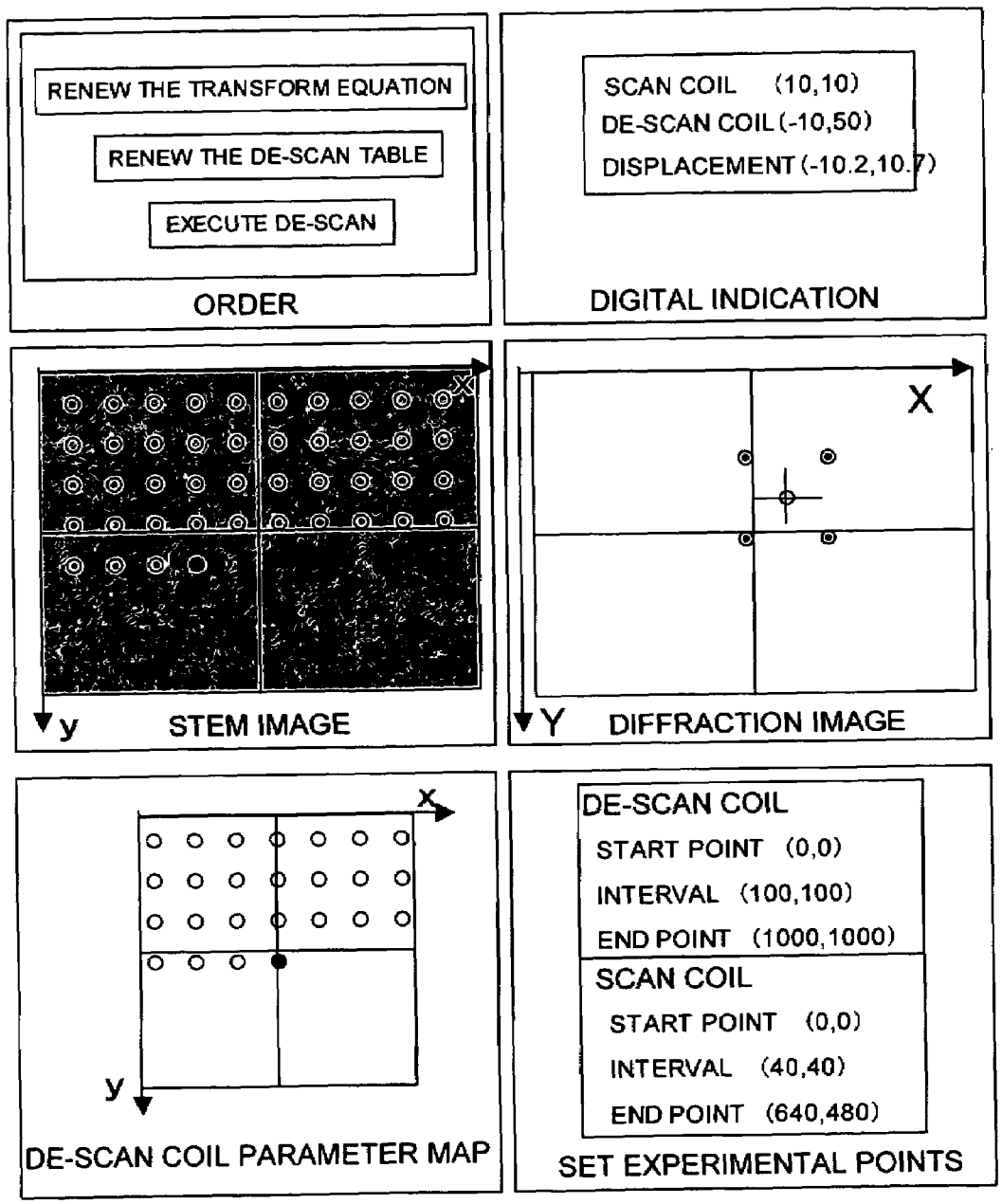
FIG. 10 is a control screen for confirming creation steps of the de-scanning table.

Incidentally, all that the end user has to do is to issue the instruction by using the de-scanning table update icon. Depending on the user, however, it is necessary to confirm whether or not the de-scanning table has been created correctly. Several sub screens therefor are prepared. FIG. 10 illustrates an example of the sub control screen. In addition to the de-scanning table update icon for issuing the instruction of creating the de-scanning table in accordance with the flowchart in FIG. 8, the following two icons are added: A conversion-expression update and adjustment icon for issuing an instruction of updating the conversion expression in accordance with the flowchart in FIG. 6, and a de-scanning execution icon for instructing on/off of the de-scanning operation based on the de-scanning table.

Also, there is provided a display unit for digital-displaying the control values for the respective coils and the displacement quantities analyzed by using the image processing. As the display function, it is also advisable that the control values for the scanning coil 5 be indicated by circle marks on the STEM image photographed immediately before the control. A position whose analysis has been already finished is indicated by a hollow circle mark, and a position whose analysis is under way at present is indicated by a circle mark with another display color. The analysis results of the displacement quantities of the diffraction image are indicated by cross-character marks on the diffraction image. The control values for the de-scanning coil 11 are also indicated by circle marks on a two-dimensional map. This makes it easier to intuitively understand progression state of the analysis and correspondence between the control values for the de-scanning coil and the analysis results of the displacement quantities. There is also provided a set unit for specifying the measurement points.

Figure 11A:
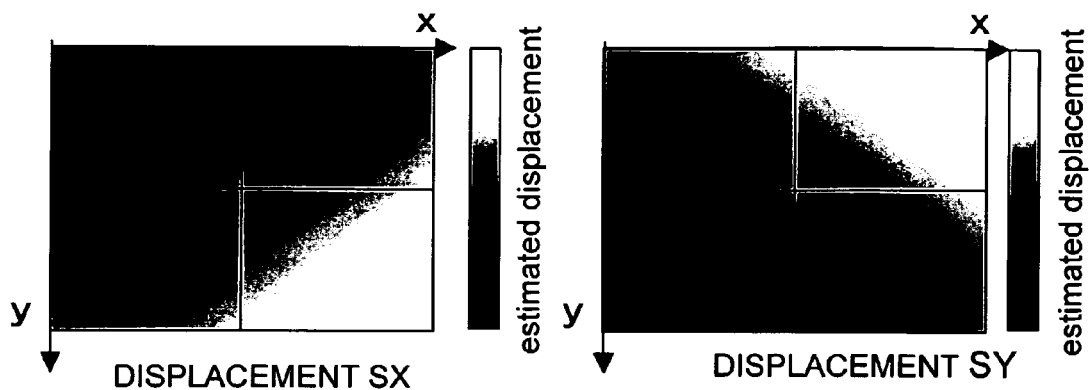
FIG. 11A to FIG. 11C are de-scanning-table display screens for confirming respective de-scanning tables created.
Figure 11B:
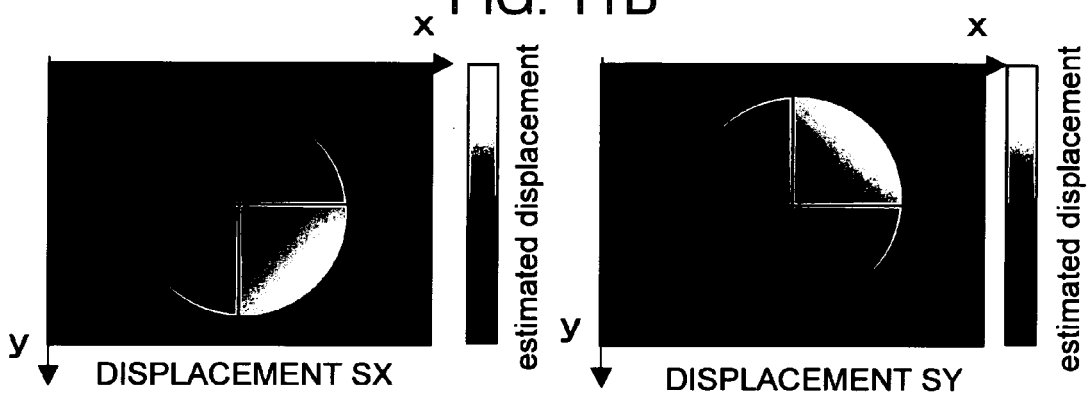
Figure 11C:
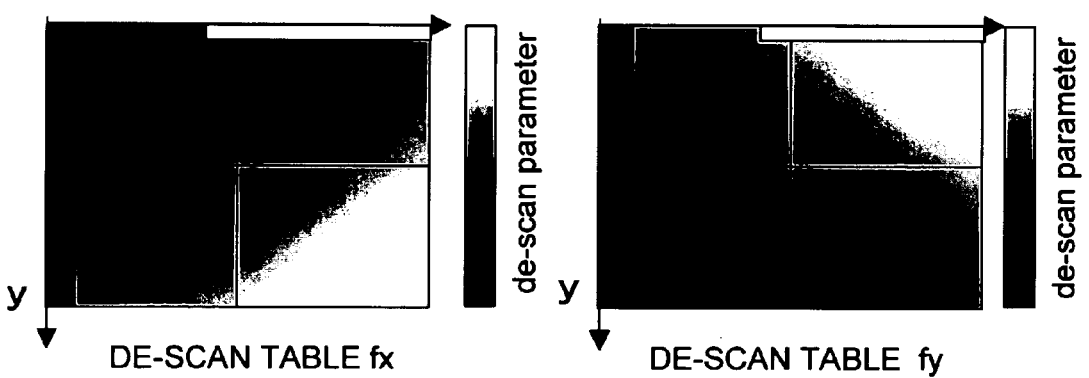

Also, there is provided a display unit for displaying the created de-scanning table (FIG. 11A to FIG. 11C). The analysis results of the displacement quantities of the diffraction image are displayed as two-dimensional images. This display makes it easier to perform confirmation of the analysis results. The analysis results (FX, FY) of the diffraction-image displacement quantities at the coil control values (fx, fy) are respectively displayed as the two-dimensional images. The changes in the displacement quantities can be assumed to be smooth. As a result, if the displacement quantities are analyzed correctly, smooth analysis results are displayed as illustrated in FIG. 11A. If the displacement quantities could not be analyzed because the coil control-value change quantities are too large and thus the displacement quantities of the diffraction image become too large, as illustrated in FIG. 11B, the analysis results steeply change in proximity to the analysis-incapable locations.

When performing the interpolation processing in order to create the de-scanning table from the displacement quantities, the interpolation processing needs to be performed in such a manner that the result at a point which could not be analyzed is excluded, and that the result at a point which could be analyzed is utilized. The judgment as to whether or not the displacement quantities could be analyzed can be made from the correlation values between the images. The confirmation as to whether or not the de-scanning control values on the peripheral portions are correctly evaluated by this interpolation processing is also performed on the above-described two-dimensional image display of the de-scanning table. If, as illustrated in FIG. 11C, the values on the peripheral portions are not correctly evaluated, it is required to modify the measurement condition and to perform the analysis once again.

As having been explained so far, in the system where the de-scanning coil makes it possible to cancel the displacement of the diffraction image caused by the primary-electron-beam scanning, the most important device performance is the correction accuracy. In the conventional control system, however, implementation of an enhancement in the correction accuracy has required a complicated and troublesome device adjustment. Accordingly, we have devised the following system: Namely, the de-scanning table is created from the actually-measured results of the displacement quantities of the diffraction image. Then, the de-scanning coil is controlled in a manner of being synchronized with the primary-electron-beam scanning. This system has allowed simultaneous implementation of both the enhancement in the correction accuracy and the simplicity of the device adjustment. The enhancement in the correction accuracy makes it possible to enlarge the field-of-view of the STEM image. Also, it becomes possible to make smaller the hole diameter of the angle selection aperture. This also allows an enhancement in the selection accuracy of the transmitted electron beam.

Embodiment 2

Figure 13:
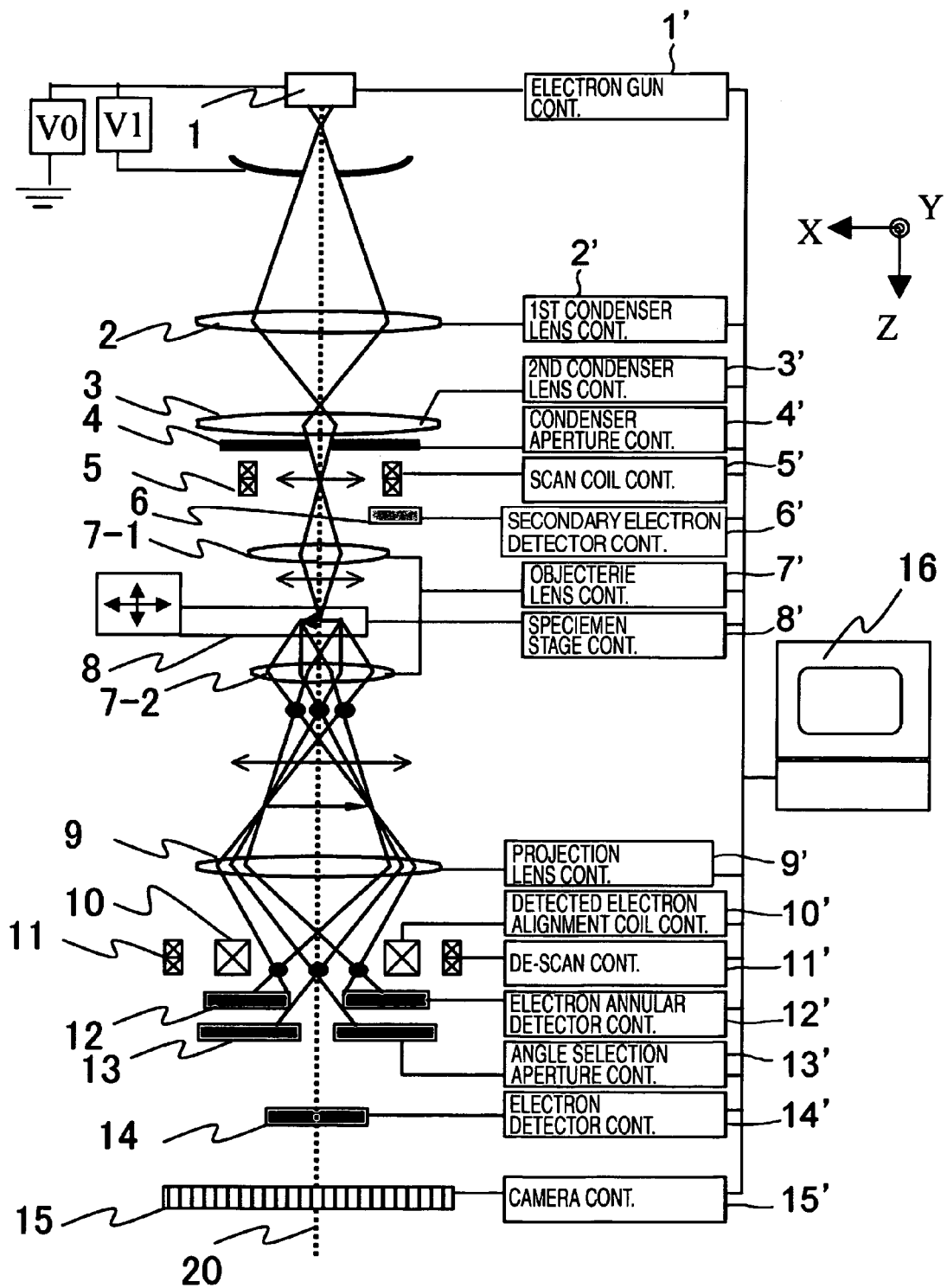
FIG. 13 is a basic configuration diagram of the STEM used in a second embodiment.
Figure 14:
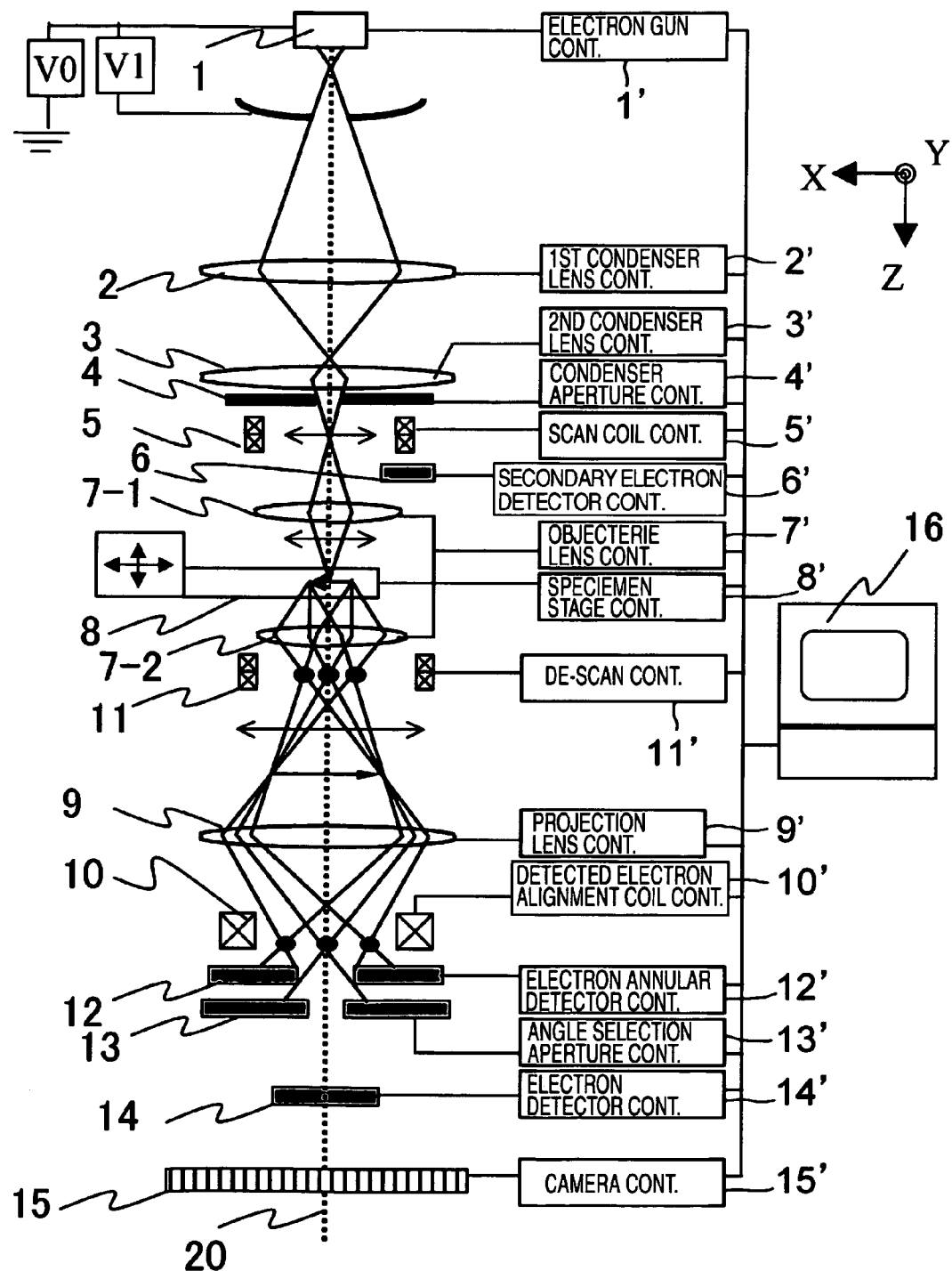
FIG. 14 is a basic configuration diagram of the STEM used in the second embodiment.
Figure 15:
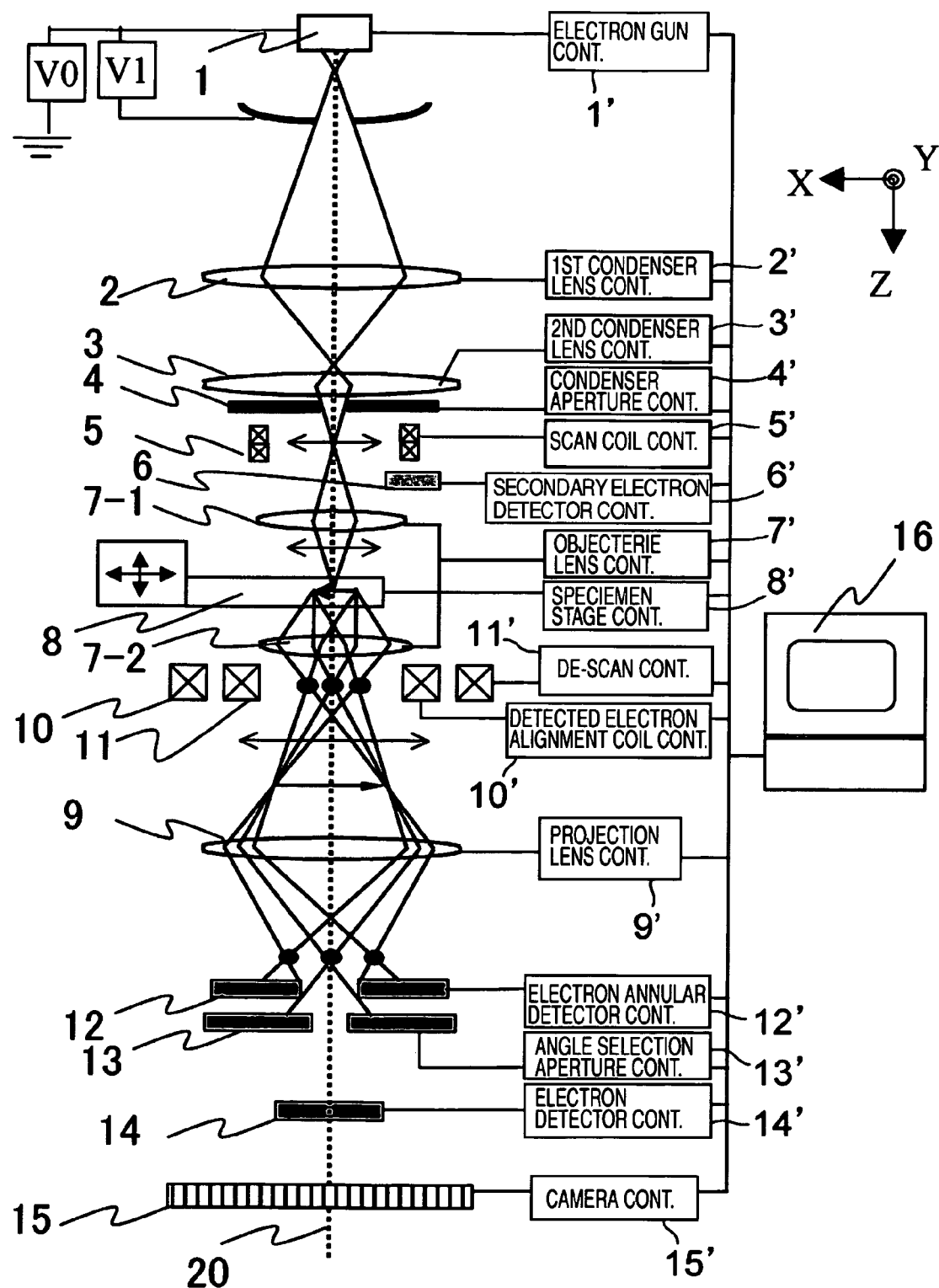
FIG. 15 is a basic configuration diagram of the STEM used in the second embodiment.

In the first embodiment, as the de-scanning coil 11, the one-stage deflection coil has been used which is set up between the projection lens 9 and the electron detector 14. It is also possible, however, to carry out the de-scanning by using some other coil. For example, as illustrated in FIG. 13, carrying out the de-scanning by using a two-stage deflection coil is also allowable. The two-stage deflection exhibits a disadvantage that the deflection quantity becomes smaller than that of the one-stage deflection. However, the two-stage deflection exhibits an advantage that it becomes possible to adjust both of the angle and the position of the electron beam.

Also, in order to clarify the functions of the respective coils, the detected-electron alignment coil 10 and the de-scanning coil 11 have been described in the separate manner. It is also possible, however, to implement these functions by using a single coil. Namely, if it is wished to simplify the coil control mechanism, integrating the coils into the single coil is advisable. Also, it is also possible to set the position of the de-scanning coil between the objective lens and the projection lens. This setting, however, complicates the correspondence between the control-value change quantities of the de-scanning coil 11 and the displacement quantities of the diffraction image.

Embodiment 3

Figure 16:
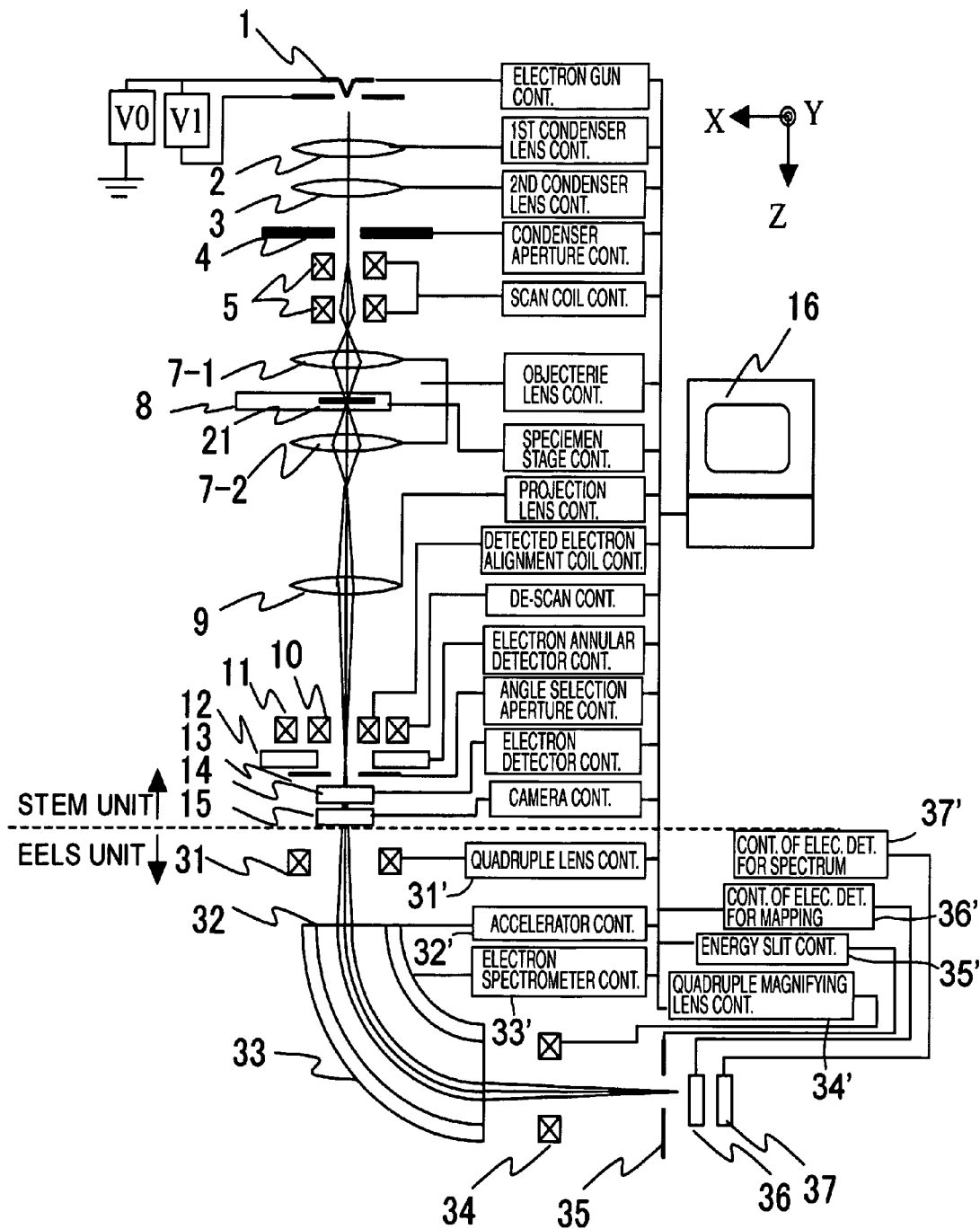
FIG. 16 is a basic configuration diagram of the STEM-EELS used in a third embodiment.

FIG. 16 illustrates a basic configuration diagram of the STEM-EELS used in the present embodiment. The EELS is installed on the lower portion of the STEM. In order to allow the transmitted electron beam to be detected by the EELS, as is the case with the angle selection aperture 13 and the electron detector 14, the electron detection camera 15 is also formed into a movable-type mechanism. The EELS includes a quadrupole lens 31, an accelerator 32, an electron spectrometer 33, a quadrupole magnifying lens 34, an energy slit 35, a mapping-use electron detector 36, a spectrum-use electron detector 37, and control units therefor.

Next, the explanation will be given below concerning processing steps for acquiring an EELS image by using the device illustrated in FIG. 16. First of all, the STEM image is acquired in accordance with the processing steps illustrated in the first embodiment. Moreover, a transmitted electron beam to which an energy spectroscopy is to be applied is selected using the angle selection aperture 13. Then, the electron detector 14 and the electron detection camera 15 are deviated from the optical axis, thereby allowing the transmitted electron beam to enter the EELS. The electrons which have entered the EELS are energy-dispersed by the electron spectrometer 33, then being magnified by the quadrupole magnifying lens 34, and being projected onto the detectors. Furthermore, at first, the mapping-use electron detector 36 and the energy slit 35 are deviated from the optical axis, thus acquiring the energy spectrum by using the spectrum-use electron detector 37. Then, the energy spectrum is displaced in parallel by using the accelerator 32, thereby making an adjustment so that the transmitted electron beam having an energy width to be detected will pass through the energy slit 35. After the adjustment, the energy slit 35 and the mapping-use electron detector 36 are inserted onto the optical axis. This insertion causes an output signal from the mapping-use electron detector 36 and the primary-electron-beam scanning signal to be synchronized with each other, thereby making it possible to acquire the EELS image.

If the position of a diffraction image on the EELS incident surface is changed by the primary-electron scanning, orbits of the transmitted electrons which are passing through inside the EELS change. As a result, positions of the transmitted electrons projected onto the electron detectors change. On account of this, a transmitted electron beam whose energy width differs from a predetermined energy width will pass through the energy slit 35, eventually entering the mapping-use electron detector 36. In order to prevent this phenomenon from occurring, there is provided a de-scanning coil 11 for canceling the displacement of the diffraction image on the EELS incident surface, the displacement being caused by a change in the incident position of the primary electron beam on the specimen. Control over this de-scanning coil 11 is performed using the de-scanning coil control system illustrated in FIG. 1. A control value for the scanning coil 5 is outputted from the DBC circuit. While being synchronized with this digital control signal, values in a de-scanning table registered in the FM (2) are outputted to the de-scanning coil 11. Here, the de-scanning table is created as follows: Diffraction images before and after activating the scanning coil 5 and the de-scanning coil 11 are photographed using a camera. Then, based on a result acquired by analyzing a displacement quantity of the diffraction images, the de-scanning table is created. First, a displacement quantity of the diffraction images caused by the de-scanning coil 11 is analyzed. From this result, a conversion expression is acquired which is used for determining a control-value change quantity of the de-scanning coil 11 needed for displacing the diffraction image by a predetermined quantity. Next, a displacement quantity of the diffraction images caused by the scanning coil 5 is analyzed. From the above-described conversion expression, control-value change quantities of the de-scanning coil 11 needed for canceling displacement quantities of the diffraction image are determined, then being recorded into the FM (2) as the de-scanning table. The control values read from the de-scanning table are sent to the de-scanning coil 11 in response to the incident position Rs of the primary electron beam on the specimen. This makes it possible to execute the high-accuracy de-scanning.

Embodiment 4

Figure 17:
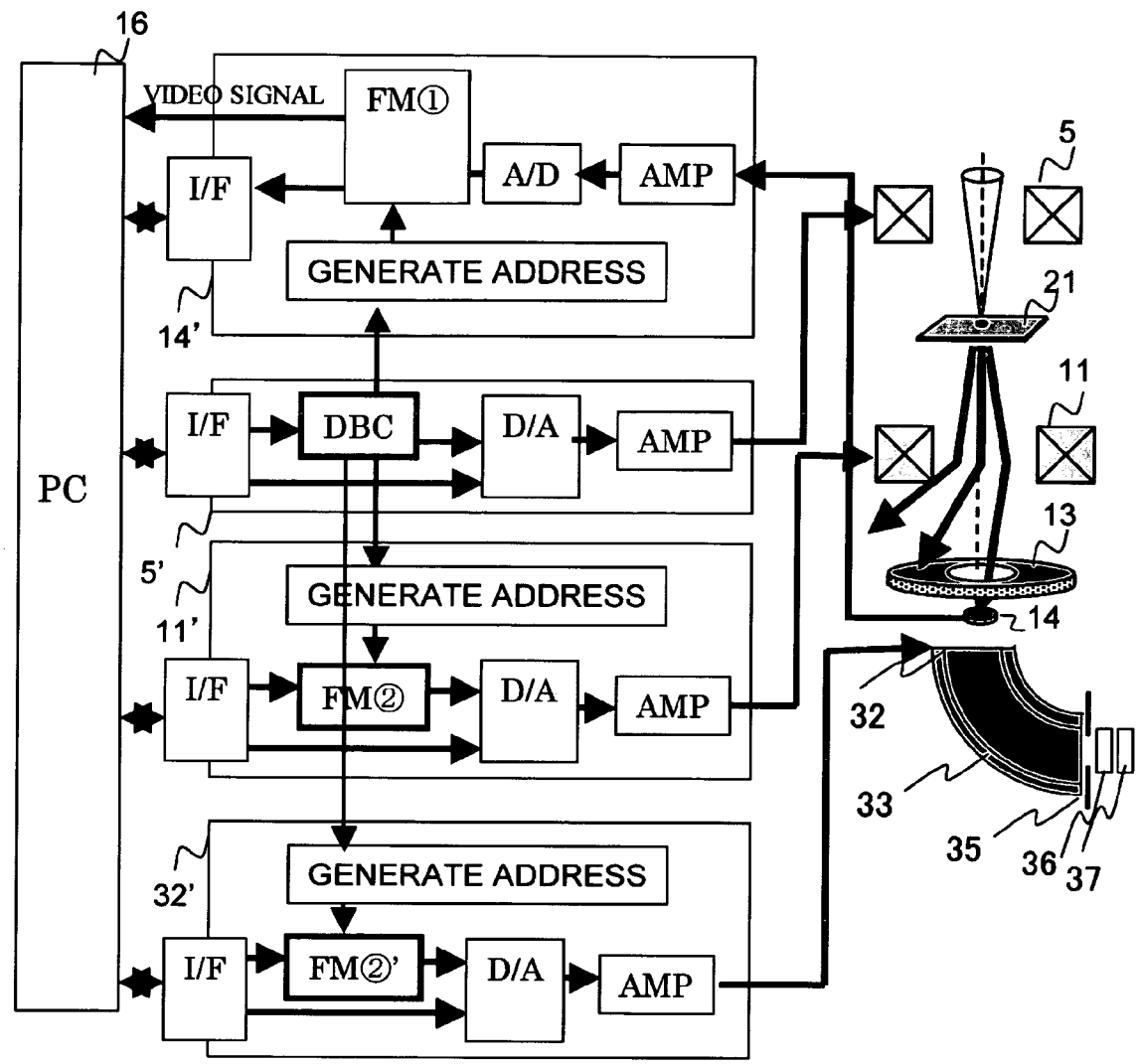
FIG. 17 is a basic configuration diagram of a de-scanning system for the STEM-EELS used in the third embodiment.

In the third embodiment, the explanation has been given concerning the technique where the use of the FM (2) and the de-scanning coil 11 makes it possible to correct the position change in the diffraction image on the EELS incident surface caused by the primary-electron-beam scanning. In the present embodiment, the explanation will be given below regarding a technique where the use of the accelerator 32 makes it possible to correct the position of the transmitted electron beam relative to the energy slit 35. FIG. 17 illustrates a configuration diagram of a control system for the de-scanning coil 11 and the accelerator 32. A de-scanning table to be used for the de-scanning coil 11 is created in accordance with the processing steps described in the first embodiment, then being recorded into the FM (2). Moreover, while being synchronized with the scanning coil 5, values in the de-scanning table registered in the FM (2) are sent to the de-scanning coil 11. In the EELS, the image on the incident surface reaches the emission surface in a manner of being magnified. As a result, the incident position of or the angle change in the transmitted electron beam on the incident surface is projected onto the energy slit 35 in a manner of being magnified inside the EELS. In order to correct this phenomenon so that the transmitted electron beam having a predetermine energy width will pass through the energy slit, the position of the transmitted electron beam relative to the energy slit 35 is corrected using the accelerator 32.

In order to implement this correction by using the accelerator, a FM (2)' is provided. Then, taking advantage of zero-loss spectrum, a displacement of the energy spectrum caused by the primary-electron-beam scanning is measured. Next, control values of the accelerator 32 needed for canceling this displacement are determined, then being stored into the FM (2)'. The data stored into the FM (2)' are the data which are measured while correcting the position of the diffraction image on the EELS incident surface by using the FM (2) and the de-scanning coil 11. It is required to update the data in the FM (2)' without fail whenever the data in the FM (2) are modified. Furthermore, while being synchronized with the control over the scanning coil 5, the data in the FM (2) are sent to the de-scanning coil 11. Simultaneously therewith, the data in the FM (2)' are sent to the accelerator 32. This makes it possible to enhance the de-scanning accuracy even further.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electron microscope, comprising:
    an electron gun for generating a primary electron beam, and a control unit for said electron gun,
    an irradiation-system lens for converging said primary electron beam to irradiate said converged primary electron beam to a specimen, and a control unit for said irradiation-system lens,
    a scanning coil for scanning said converged primary electron beam on said specimen, and a control unit for said scanning coil,
    a specimen stage for holding said specimen, and a control unit for said specimen stage,
    an electron detector for detecting an electron beam which has transmitted said specimen, and a control unit for said electron detector, and
    an image formation unit for forming an image by synchronizing an output value from said electron detector with a control value for said scanning coil, and a control unit for said image formation unit, wherein,
    said electron microscope further comprises:
    a correction unit for correcting a displacement of said transmitted electron beam relative to said electron detector, said displacement of said transmitted electron beam being caused by a displacement of said primary electron beam relative to said specimen,
    a measurement unit for measuring said displacement of said transmitted electron beam,
    an analysis unit for determining a correction-unit control value needed for correcting said displacement of said transmitted electron beam,
    a memory for recording said correction-unit control value, and
    a control unit for outputting said correction-unit control value to said correction unit in synchronization with said control over said scanning coil, said correction-unit control value being recorded in said memory.

2. The electron microscope according to claim 1, wherein said measurement unit includes
    a camera for photographing a diffraction image of said transmitted electrons, and
    an image processing unit for analyzing a displacement quantity between said diffraction images by an image processing, said diffraction images being photographed by said camera.

3. The electron microscope according to claim 1, wherein said correction unit is a deflection coil set up between said specimen and said electron detector.

4. The electron microscope according to claim 1, wherein said measurement unit includes
    a detector for detecting a spectrum of said transmitted electron beam to which an energy spectroscopy has been applied by an electron spectrometer, and
    an analysis unit for analyzing a displacement quantity between said spectrums detected by said detector.

5. The electron microscope according to claim 1, wherein said correction unit is an acceleration unit of an electron spectrometer, said acceleration unit changing position of a spectrum relative to said electron detector.

6. An electron microscopy method, comprising the steps of:
    generating a primary electron beam from an electron gun,
    converging said primary electron beam to irradiate said converged primary electron beam to a specimen,
    scanning said converged primary electron beam within surface of said specimen,
    detecting, by an electron detector, a transmitted electron beam which has transmitted said specimen, and
    forming an image by synchronizing an output value from said electron detector with a control value for a scanning coil, wherein,
    said electron microscopy method further comprises the steps of:
    analyzing a control value for a correction unit, said correction unit correcting a displacement of said transmitted electron beam relative to said electron detector, said displacement of said transmitted electron beam being caused by a displacement of said primary electron beam relative to said specimen, recording said correction-unit control value into a memory, and outputting said correction-unit control value to said correction unit in synchronization with said control over said scanning coil, said correction-unit control value being recorded in said memory.

7. The electron microscopy method according to claim 6, wherein said step of analyzing said control value for said correction unit includes the steps of:

measuring a displacement of said transmitted electron beam relative to said electron detector, said displacement of said transmitted electron beam being caused by a change in said control value for said correction unit, measuring a displacement of said transmitted electron beam relative to said electron detector, said displacement of said transmitted electron beam being caused by a change in said control value for said scanning coil, and determining a correction-unit control value quantity, said correction-unit control value quantity being needed for canceling said displacement of said transmitted electron beam caused by said change in said control value for said scanning coil.

8. The electron microscopy method according to claim 6, wherein said displacement of said transmitted electron beam relative to said electron detector according to claim 6 is said displacement of said transmitted electron beam relative to an aperture, said aperture restricting diffraction angle range of said transmitted electrons to be detected by said electron detector.

9. The electron microscope according to claim 1, wherein said displacement of said transmitted electron beam relative to said electron detector is said displacement of said transmitted electron beam relative to an energy slit, said energy slit selecting an electron beam with a predetermined energy width out of an electron beam to which an energy spectroscopy has been applied by an electron spectrometer.

10. The electron microscope according to claim 1, wherein said correction unit is provided with a user interface for issuing any one of an instruction of analyzing said correction-unit control value, an instruction of recording said correction-unit control value, and an instruction of outputting said correction-unit control value.

* * * * *